(12) United States Patent
Zhang et al.

(10) Patent No.: US 6,310,403 B1
(45) Date of Patent: Oct. 30, 2001

(54) METHOD OF MANUFACTURING COMPONENTS AND COMPONENT THEREOF

(75) Inventors: Chunsheng Zhang; Jong-Kai Lin, both of Chandler; Scott E. Lindsey, Mesa; Yifan Guo; Li Li, both of Gilbert, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/652,620

(22) Filed: Aug. 31, 2000

(51) Int. Cl.[7] .......................... H01L 23/48; H01L 23/52; H01L 29/40
(52) U.S. Cl. .......................... 257/786; 257/777; 257/780; 257/778; 438/110
(58) Field of Search .................................. 257/780, 781, 257/777, 686, 778, 786, 747; 438/108, 109, 110, 613, 107

(56) References Cited

U.S. PATENT DOCUMENTS

| | | | |
|---|---|---|---|
| 5,471,090 | * | 11/1995 | Deutsch et al. . |
| 6,005,292 | * | 12/1999 | Roldan et al. . |
| 6,046,910 | * | 4/2000 | Ghaem et al. . |
| 6,118,181 | * | 9/2000 | Merchant et al. . |
| 6,232,668 | * | 5/2001 | Hikita et al. . |
| 6,271,597 | * | 8/2001 | Medlon et al. . |

OTHER PUBLICATIONS

A. Beikmohamadi et al.—DuPont Co. & G. Hotchkiss et al.—Texas Instruments, Inc., "Tacky Dots™ Technology for Flip Chip and BGA Solder Bumping", IEEE, Jun. 1998.

* cited by examiner

Primary Examiner—Sheila V. Clark

(57) ABSTRACT

A method of manufacturing components includes providing a substrate (110, 531, 631, 700) having a first coefficient of thermal expansion (CTE), having a first surface (111), and supporting a first plurality of interconnects located over the first surface in a first predetermined pattern. The method also includes providing another substrate (190) having a second CTE, having a second surface (195), and supporting a second plurality of interconnects located over the second surface in a second predetermined pattern. The method further includes assembling together the two substrates at a first temperature outside of a temperature range of approximately 25 to 30° C.

41 Claims, 3 Drawing Sheets

METHOD OF MANUFACTURING COMPONENTS AND COMPONENT THEREOF

FIELD OF THE INVENTION

The invention relates to electronics, in general, and to substrate assemblies, in particular.

BACKGROUND OF THE INVENTION

Many electronic components are comprised of different substrates that are assembled together. Typically, each substrate has a different Coefficient of Thermal Expansion (CTE). As an example, an electronic component can include a semiconductor substrate or chip mounted on an organic substrate. The CTE difference between the chip and the organic substrate is on the order of 15 parts per million per degree Celsius (ppm/° C.). Bond pads of the chip should be aligned to bond pads of the organic substrate at room temperature, but the large difference in thermal expansion produces a thermal mismatch at a solder reflow temperature that can cause significant misalignment of the bond pads of the chip and the organic substrate.

Interconnect bumps such as solder balls are typically used to electrically connect the bond pads of the chip to the bond pads of the organic substrate, but the thermal mismatch between the chip and the organic substrate distorts the shape and height of the solder balls. The irregular shape and height of the solder balls increases the localized tensile stress within the solder balls at an interface between the solder balls and the bond pads. Experiments have shown that this stress can produce cracks within a solder ball, within a bond pad, and at the interface between a solder ball and a bond pad. These cracks significantly degrade the reliability of the component. Other experiments have shown that the thermal mismatch problem and the reliability problem increase in severity as the size of the chip and the organic substrate increases.

The solder balls used to electrically connect the bond pads are typically comprised of a lead-based solder such as, for example, tin lead solder. These leadbased solders have melting temperatures generally above 180° C. These lead-based solders, however, are toxic. Replacing these lead-based solders with lead-free solders makes the components safer, but also increases the thermal mismatch and reliability problems because the lead-free solders have melting temperatures generally above 220° C. The higher melting temperatures of the lead-free solders increase the severity of the thermal mismatch problem, which degrades the reliability of the components even further due to the increased possibility of interconnect cracking.

Accordingly, a need exists for a method of manufacturing components and a component thereof that reduces the localized tensile stress within the interconnect bumps.

BRIEF DESCRIPTION OF THE DRAWINGS

The invention will be better understood from a reading of the following detailed description, taken in conjunction with the accompanying drawing figures in which.

Figure 1:
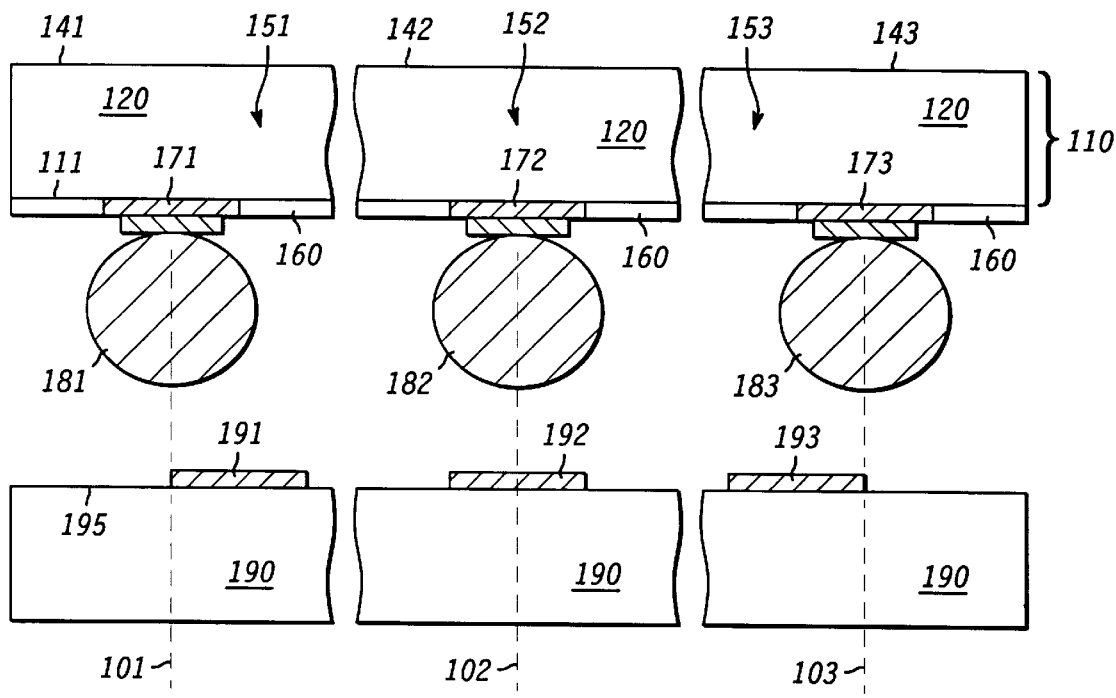
FIGS. 1, 2, and 3 illustrate cross-sectional views of portions of a component after different steps of a manufacturing process in accordance with an embodiment of the present invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms left, right, front, back, top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

Figure 2:
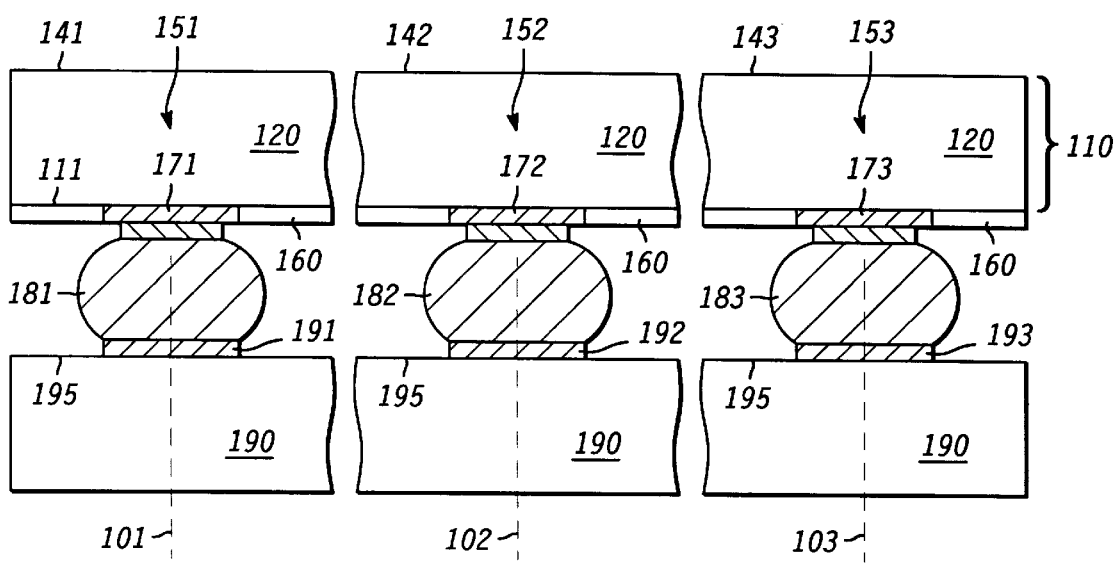
Figure 3:
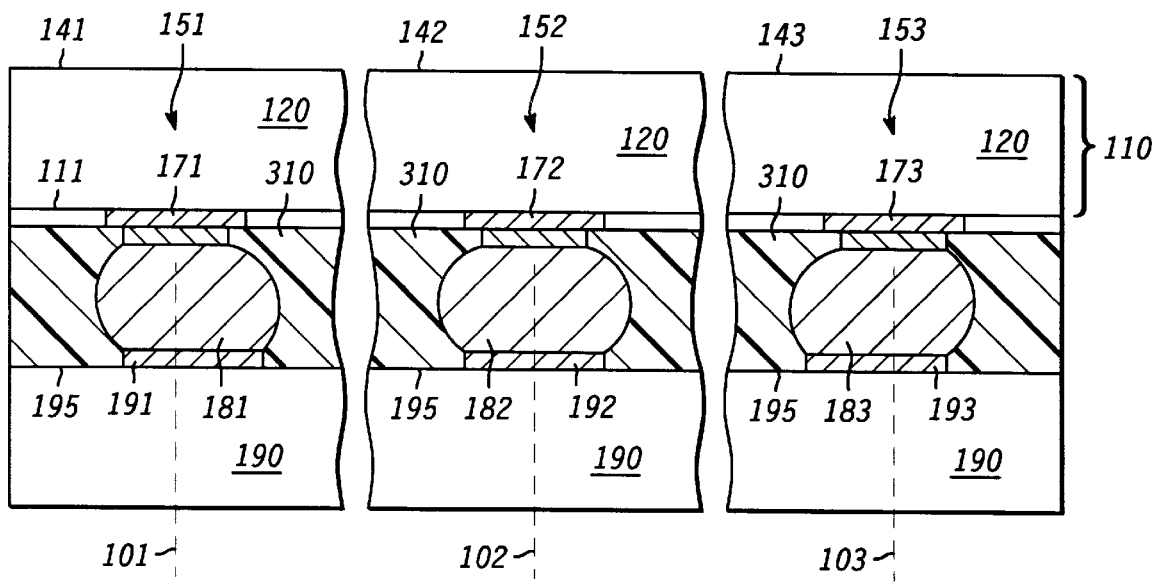

FIGS. 1, 2, and 3 illustrate cross-sectional views of portions of a component 100 after different steps of a manufacturing process. In the preferred embodiment, component 100 is a flip-chip semiconductor component having a semiconductor substrate or chip and a mounting or capping substrate. However, component 100 can also represent other substrate assemblies.

Component 100 uses an interconnect compensation design to alleviate the localized stress caused by the chip-to-substrate thermal mismatch within component 100. A predetermined pattern of interconnects in the chip and/or the capping substrate of component 100 is scaled or altered such that the amount of mismatch between the interconnects of the chip and the capping substrate at room temperature is approximately equal to the difference in thermal expansion between the chip and the capping substrate at a solder solidification temperature. After the chip and the capping substrate are heated up to at least the solder melting temperature, the chip and the capping substrate are cooled down to a solder solidification temperature at which the interconnects of the chip and the capping substrate are substantially aligned together. This interconnect compensation design maintains a desired interconnect bump shape during bump solidification to reduce the localized tensile stress within the interconnect bumps. The interconnect design also maintains a desired height of the interconnect bumps to maintain a standoff height between the chip and the capping substrate.

In FIG. 1, component 100 includes a first substrate 110, which is preferably comprised of at least a semiconductor substrate 120. Substrate 110 can also be comprised of other semiconductor layers, electrically insulative or dielectric layers, and metal layers. A left portion 141, a middle portion 142, and right portion 143 of substrate 110 are illustrated in FIG. 1. Substrate 110 has a surface 111.

Substrate 110 has a first CTE, which in the preferred embodiment is determined predominately by the CTE of semiconductor substrate 120. When substrate 120 is comprised of single crystal silicon, substrate 110 can have a first CTE of approximately 2.5 ppm/° C.

A semiconductor device is supported by substrate 110. As an example, the semiconductor device can be a discrete transistor or an integrated circuit. Details of the semiconductor device are not illustrated in FIG. 1 to simplify the explanation of the present invention. A left portion 151, a middle portion 152, and a right portion 153 of the semiconductor device is located within portions 141, 142, and 143, respectively, of substrate 110.

A first interconnect system is supported by surface 111 of substrate 110. The first interconnect system can include a Multi-Layered Metallization (MLM) system, but FIG. 1 illustrates a single-layer metallization system. The interconnect system in FIG. 1 includes a first plurality of interconnects arranged in a first predetermined pattern. The first predetermined pattern is explained in more detail hereinafter. Portions 171, 172, and 173 of the first plurality of interconnects are supported by portions 141, 142, and 143, respectively, of substrate 110. Portions 171, 172, and 173 are also referred to as bonding pads and are electrically coupled to the semiconductor device supported by substrate 110. Each of portions 171, 172, and 173 can be comprised of a metal layer and an Under Bump Metal (UBM) layer. The metal layer is located between substrate 110 and the UBM layer and can be comprised of aluminum or copper. The UBM layer can be comprised of several layers including layers of chromium and copper; layers of titanium, tungsten, and copper; or layers of nickel and gold. An electrically insulative, dielectric, or passivation layer 160 is located adjacent to and supported by surface 111 of substrate 110 to cover portions of surface 111 of substrate 110 that are not covered by the first plurality of interconnects.

A plurality of interconnect bumps are disposed adjacent to the first plurality of interconnects. In particular, FIG. 1 illustrates bumps 181, 182, and 183 located adjacent to and electrically coupled to portions 171, 172, and 173, respectively, of the first plurality of interconnects. Bumps 181, 182, and 183 can be comprised of solder or other flip-chip bump materials. As an example, bumps 181, 182, and 183 can be comprised of a lead-based solder, but are preferably comprised of a leadfree or tin-based solder such as tin silver, tin copper, or tin silver copper. Bumps 181, 182, and 183 can be formed by using plating processes, stencil printing processes, evaporation techniques, ball attachment processes, or the like.

FIG. 1 also depicts a second substrate 190. Substrate 190 is also referred to as a mounting or capping substrate. As an example, substrate 190 can be comprised of an organic material, a Printed Circuit Board (PCB), a polyimide material, a semiconductor material, a glass material, or a ceramic material. Substrate 190 has a second CTE that is different from the first CTE of substrate 110. As an example, substrate 190 can have a second CTE of approximately 15 to 25 ppm/° C. when substrate 190 is a PCB substrate.

A second interconnect system is located over a surface 195 of substrate 190. The second interconnect system can include a Multi-Layered Metallization (MLM) system, but FIG. 1 illustrates a single-layer metallization system. The second interconnect system includes a second plurality of interconnects arranged in a first predetermined pattern and supported by a surface 195 of substrate 190. Portions 191, 192, and 193 of the second plurality of interconnects are illustrated in FIG. 1. Portions 191, 192, and 193 are also referred to as bonding pads. The second plurality of interconnects are arranged in a second predetermined pattern that is similar to, but different from, the first predetermined pattern for the first plurality of interconnects supported by substrate 110. The second predetermined pattern is a compressed or scaled-down version of the first predetermined pattern where the spacing between the centers of adjacent portions or bonding pads of the second plurality of interconnects is smaller than the spacing between the centers of adjacent portions or bonding pads of the first plurality of interconnects. In a different embodiment where the CTE of substrate 190 is smaller than the CTE of substrate 110, the second predetermined pattern for the second plurality of interconnects supported by substrate 190 would be expanded or enlarged, instead of compressed, compared to the first predetermined pattern for the first plurality of interconnects supported by substrate 110. In this other embodiment, the spacing between the centers of adjacent portions or bonding pads of the second plurality of interconnects is larger than the spacing between the centers of adjacent portions or bonding pads of the first plurality of interconnects.

As an example, the different spacings between the centers of adjacent bonding pads supported by the two substrates can be approximated by the following equations:

$$X' = (1 - \Delta\alpha\Delta T)X \qquad (\text{Eq.1})$$

$$Y' = (1 - \Delta\alpha\Delta T)Y \qquad (\text{Eq.2})$$

where X and Y represent the X and Y coordinates of the center of a bonding pad supported by the substrate with the smaller CTE, where X' and Y' represent the X and Y coordinates of the center of a corresponding bonding pad supported by the substrate with the larger CTE, where $\Delta\alpha$ is the magnitude of the difference in CTE between the two substrates, where $\Delta T$ is the magnitude of the difference in temperature between the solder solidification temperature and room temperature. Alternatively, $\Delta T$ can represent the magnitude of the difference in temperature between the temperature of the substrate during the solder solidification step and the temperature of the substrate at room temperature. The origin or (0,0) location of the Cartesian coordinate system identified by Equations 1 and 2 is located at the center of the substrates. Equations 1 and 2 are used when the location of the center of each bonding pad supported by the substrate having the larger CTE is compensated individually. Modifications of Equations 1 and 2 can be used to compensate individually the location of the center of each bonding pad supported by the substrate having the smaller CTE.

As shown by Equations 1 and 2, the amount of compensation for the location of the center of the bonding pads increases as the bonding pads move away from the center of the substrate. Accordingly, a maximum amount of compensation is applied to the location of bonding pads around a periphery of the substrates, and a minimum amount of compensation is applied to the location of bonding pads around the center of the substrates. In some cases, the minimum amount of compensation can be zero.

Substrates 110 and 190 can be assembled together using an alignment step, a heating step, an electrical coupling or contacting step, a cooling step, and a solidification step. The sequence of these steps can be altered, and some of the steps can be performed simultaneously with each other.

During the alignment step, the centers of substrates 110 and 190 can be aligned together. As an example, this alignment step can be performed by using alignment keys located at various locations, including non-central locations, across each of substrates 110 and 190. The center of substrate 110 can be aligned to the center of substrate 190; the center of substrate 190 can be aligned to the center of substrate 110; or the centers of substrates 110 and 190 can be aligned with each other. Accordingly, portion 172 of the first plurality of interconnects supported by substrate 110 is properly aligned to portion 192 of the second plurality of interconnects supported by substrate 190. A dashed line 102 drawn through the center of portion 172 extends through the center of portion 192.

The alignment step can be performed at room temperature or within a temperature range of approximately 25 to 30° C. At this temperature or within this temperature range, portion 171 of the first plurality of interconnects supported by substrate 110 is misaligned to portion 191 of the second plurality of interconnects supported by substrate 190. Accordingly, dashed line 101 drawn through the center of portion 171 does not extend through the center of portion 191. Similarly, portion 173 of the first plurality of interconnects supported by substrate 110 is misaligned to portion 193 of the second plurality of interconnects supported by substrate 190. A dashed line 103 drawn through the center of portion 173 does not extend through the center of portion 193. Accordingly, at or around room temperature, the first predetermined pattern, as a whole, is substantially misaligned to the second predetermined pattern, as a whole.

Next, the plurality of interconnect bumps are heated up to at least its melting temperature. When performed in an oven, the heating process also heats substrates 110 and 190 to approximately the same temperature as the interconnect bumps. When substrate 190 is heated, the first and second pluralities of interconnects are substantially aligned with each other. The heating process can be performed simultaneously with or before the aligning step, in which case, the first and second pluralities of interconnects will be substantially aligned together during the aligning step.

Then, the first and second pluralities of interconnects are electrically coupled together. In particular, the plurality of interconnect bumps are contacted with the second plurality of interconnects supported by substrate 190 while the plurality of interconnect bumps remain melted and while the first and second pluralities of interconnects remain substantially aligned with each other. As an example, this step can be performed by moving substrate 110 towards substrate 190, by moving substrate 190 towards substrate 110, or by moving substrates 110 and 190 towards each other.

Turning to FIG. 2, the plurality of interconnect bumps and substrates 110 and 190 are subsequently cooled down to a solidification temperature below the melting temperature and well above room temperature. At the solidification temperature, the plurality of interconnect bumps are resolidified while the first and second pluralities of interconnects remain substantially aligned with each other. In FIG. 2, dashed lines 101, 102, and 103 extend through the centers of portions 171 and 191, portions 172 and 192, and portions 173 and 193, respectively. The difference in temperature between the solidification step, the electrical coupling or contacting step, and the end of the heating step is small compared to the difference in temperature between the solidification step and the aligning step when done at or near room temperature. Therefore, the first and second pluralities of interconnects remain substantially aligned with each other from the end of the heating step through the end of the solidification step.

After the assembly process, component 100 is cooled down even further where substrates 110 and 190 shrink back towards their respective original sizes, as illustrated in FIG. 3. The shrinkage may deform the interconnect bumps to some extent. The localized stress at the interface between the interconnect bump and the bonding pad is reduced because the interconnect bumps are solidified in their normal shape, unlike in the prior art.

Also after the assembly process, an underfill material 310 is dispensed or injected between substrates 110 and 190 to package or encapsulate the interconnect bumps and the first and second pluralities of interconnects. Material 310 protects the bumps from becoming over stressed during subsequent temperature cycles. Furthermore, component 100 can be singulated, if necessary, from other components formed from other portions of substrates 110 and 190. Mis singulation step can be performed after the assembly and underfill processes, or the chips of substrates 110 and 190 can be singulated individually before the assembly process.

Figure 4:
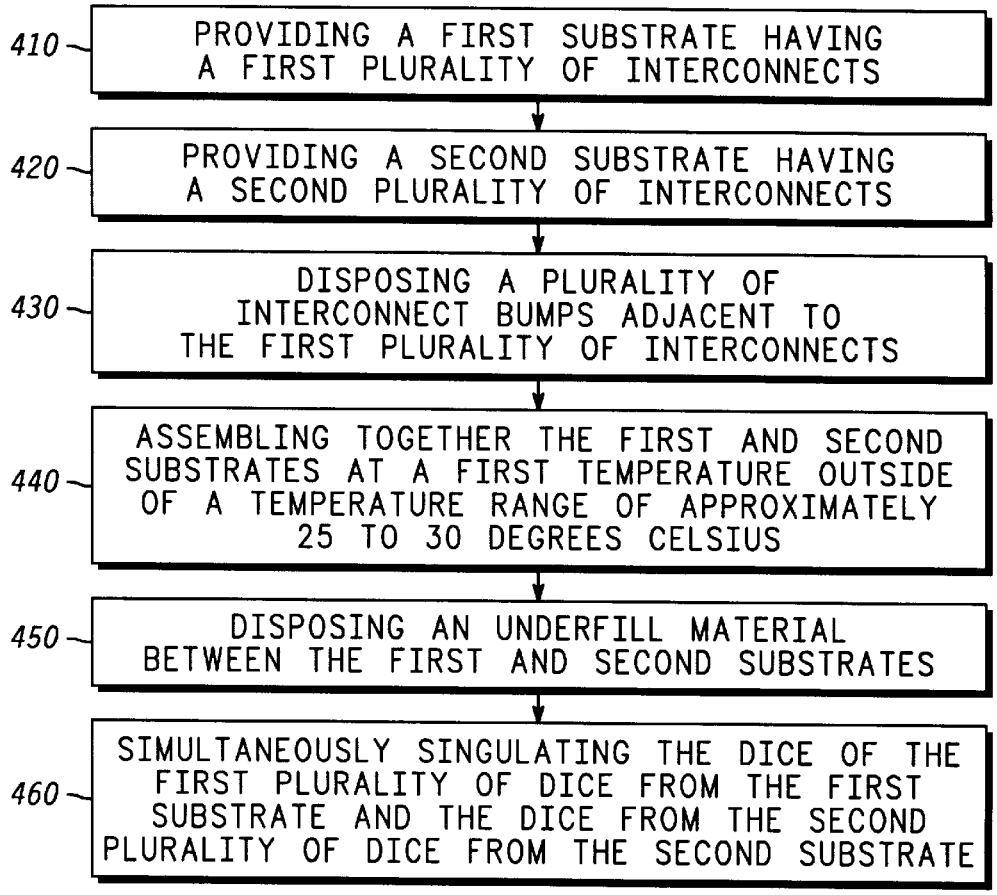
FIG. 4 illustrates a flow chart of a method of manufacturing the component of FIGS. 1, 2, and 3 in accordance with an embodiment of the present invention.

FIG. 4 illustrates a flow chart 400 of a method of manufacturing component 100 of FIGS. 1, 2, and 3. At a step 410 in flow chart 400, a first substrate supporting a first plurality of interconnects arranged in a first predetermined pattern is provided. As an example, the first substrate of step 410 can be similar to substrate 110 in FIGS. 1, 2, and 3, and the first plurality of interconnects of step 410 can be similar to the first plurality of interconnects supported by substrate 110 in FIGS. 1, 2, and 3. The first substrate can also support a semiconductor device similar to the semiconductor device supported by substrate 110 in FIGS. 1, 2, and 3. Step 410 can include manufacturing a semiconductor device and the first plurality of interconnects, or step 410 can include purchasing a substrate already having the semiconductor device and the first plurality of interconnects.

At a step 420 of flow chart 400, a second substrate supporting a second plurality of interconnects arranged in a second predetermined pattern is provided. As an example, the second substrate of step 420 can be similar to substrate 190 in FIGS. 1, 2, and 3, and the second plurality of interconnects in step 420 can be similar to the second plurality of interconnects supported by substrate 190 in FIGS. 1, 2, and 3. Step 420 can include manufacturing the second plurality of interconnects, or step 420 can include purchasing a substrate already having the second plurality of interconnects.

Then, at a step 430, a plurality of interconnect bumps are disposed adjacent to the first plurality of interconnects before assembling together the first and second substrates. The plurality of interconnect bumps of step 430 can be similar to bumps 181, 182, and 183 of FIGS. 1, 2, and 3. In another embodiment, the plurality of interconnect bumps can be attached to or disposed adjacent to the second plurality of interconnects supported by substrate 190, instead of being attached to the first plurality of interconnects supported by substrate 110.

Next, at a step 440, the first and second substrates are assembled together. As indicated earlier, the substrates are preferably assembled together at a first temperature greater than approximately 30° C. In another embodiment, however, the substrates can be assembled together at a first temperature outside of a temperature range of approximately 25 to 30° C.

After cooling the substrate back down to room temperature, an underfill material is first dispensed and then cured between the first and second substrates at a step 450 of flow chart 400. Then, at an optional step 460, component 100 and other similar components can be simultaneously singulated from the first and second substrates. Alternatively, the first and second substrates can be singulated during steps 410 and 420, respectively, or the first and second substrates can be provided in singulated form during step 410.

Figure 5:
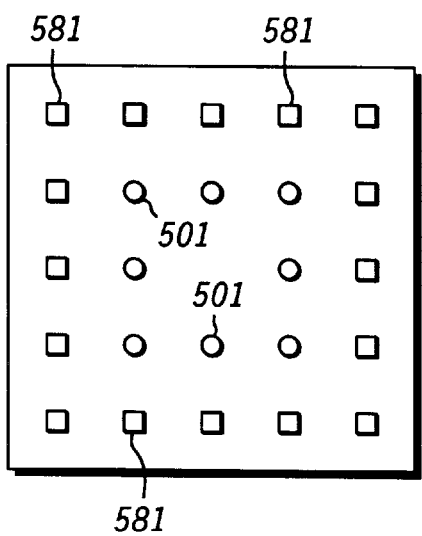
FIGS. 5 and 6 illustrate top views of different interconnect patterns in accordance with an embodiment of the present invention.
Figure 6:
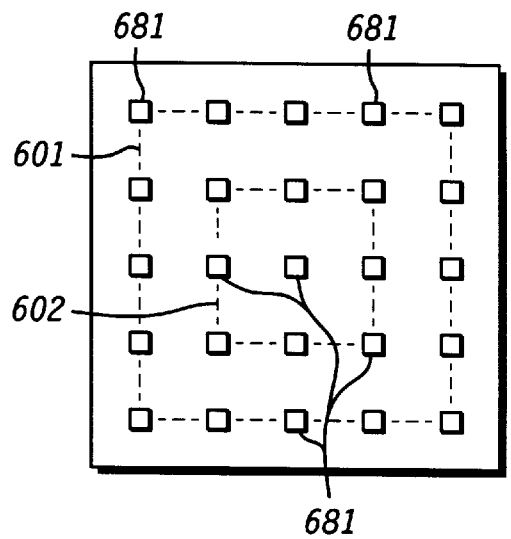

FIGS. 5 and 6 illustrate top views of different interconnect patterns. In FIG. 5, a semiconductor chip 531 includes a plurality of interconnects 581 arranged in a peripheral pattern located only at a periphery of a first surface of chip 531. In FIG. 6, a semiconductor chip 631 includes a plurality of interconnects 681 arranged in a grid pattern located across a first surface of chip 631. Interconnects 581 and 681 in FIGS. 5 and 6, respectively, can be similar to the first and second pluralities of interconnects in FIGS. 1, 2, and 3. The first plurality of interconnects supported by substrate 110 in FIGS. 1, 2, and 3 can be arranged in a pattern similar to those illustrated for interconnects 581 or 681. Interconnects 581 and 681 and the first plurality of interconnects can also be arranged in other patterns, as desired. As indicated earlier, the predetermined pattern for the second plurality of interconnects supported by substrate 190 in FIGS. 1, 2, and 3 can also be similar to the interconnect patterns of FIGS. 5 and 6, but the pattern for the second plurality of interconnects have different spacings between the centers of adjacent interconnect portions or bonding pads.

As indicated earlier, the locations of the centers of the bonding pads can be compensated individually for the CTE difference between the two substrates. In another embodiment, the locations for the centers of the bonding pads can be compensated in groups for the CTE differences between the two substrates. For example, in FIG. 6, the location of the center of each bump in the outer group of bumps 681 connected by a dashed line 601 can be compensated by a large first compensation factor, and the location of the center of each bump in the middle group of bumps 681 connected by a dotted line 602 can be compensated by small second compensation factor. The particular compensation factor used in this stepfunction compensation scheme can be determined by calculating the average distance away from the center of the substrate for all of the bumps in the particular group. This group compensation scheme can be applied to the bonding pads of either substrate.

Returning to FIG. 5, chip 531 also includes a first additional plurality of interconnects 501 that are located adjacent to interconnects 581. Interconnects 501 can be different from interconnects 581. For example, interconnects 501 can be optical interconnects while interconnects 581 can be electrical interconnects. Alternatively, both of interconnects 501 and 581 can be electrical interconnects. In addition to having the second plurality of interconnects, the capping substrate on which chip 531 is mounted preferably also has a second additional plurality of interconnects that correspond to interconnects 501 of chip 531. The locations of the second additional plurality of interconnects and interconnects 501, however, are not compensated for the CTE difference between chip 531 and the capping substrate. Accordingly, the second additional plurality of interconnects and interconnects 501 are preferably substantially aligned at or around room temperature and are preferably substantially misaligned at the elevated solder melting and solidification temperatures. If the second additional plurality of interconnects and interconnects 501 are located at the centers of chip 531 and the capping substrate, then the second additional plurality of interconnects and interconnects 501 can be substantially aligned at or around room temperature and also at the elevated solder melting and solidification temperatures.

Figure 7:
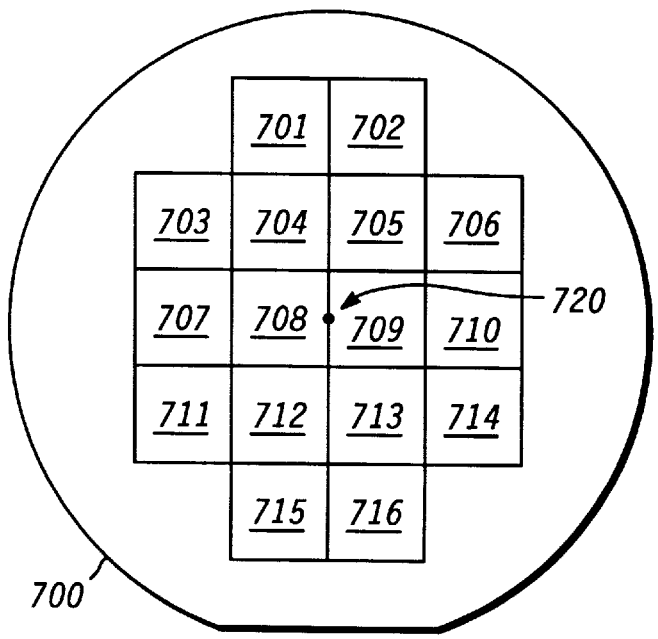
FIG. 7 illustrates a top view of a substrate containing a plurality of chips in accordance with an embodiment of the present invention.

FIG. 7 illustrates a top view of a wafer or substrate 700 containing a plurality of chips 701 through 716. Chips 701 through 716 can be singulated from substrate 700 before or after being assembled with capping substrates. If singulated after being assembled, chips 701 and 716 can be singulated after dispensing the underfill material and can be singulated simultaneously with corresponding capping chips of the capping substrate.

Substrate 700 contains a plurality of interconnects, and each of chips 701 through 716 contain a portion of the plurality of interconnects where each portion of the plurality of interconnects is similar to the first plurality of interconnects supported by substrate 110 in FIGS. 1, 2, and 3. Each of chips 701 through 716 also include at least one semiconductor device.

The patterns of interconnects in each of chips 701 through 716 of substrate 700 are preferably identical to each other and can be similar to the patterns described earlier. The location of the center of each interconnect in each of chips 701 through 716 can be compensated individually using Equations 1 and 2 where the origin of the Cartesian coordinate system is located at point 720 on substrate 700. In another embodiment, the location of the center of each interconnect within each of chips 701 through 716 can be compensated as a group by chip where, for example, the location of each interconnect within chip 701 is compensated by a single first compensation factor, the location of each interconnect within chip 702 is compensated by a single second compensation factor, and so on. In this embodiment, the compensation factor can be determined by a distance from point 720 to the center of the chip being compensated. In yet another embodiment, the location of the center of each interconnect within each of chips 701 through 716 can be first compensated as a group by chip, and then the location of the center of each interconnect within each chip can be compensated individually within each chip. These compensation schemes can be applied to the interconnects supported by the semiconductor substrate and/or the capping substrate.

Therefore, an improved method of manufacturing components and a component thereof is provided to overcome the disadvantages of the prior art. The component has an interconnect compensation design that maintains a desired interconnect bump shape during bump solidification to reduce the localized tensile stress within the interconnect bump. The magnitude of the localized tensile stress is reduced the greatest at the interfaces between the outermost bond pads and the outside corners of the outermost interconnect bumps. The interconnect compensation design also maintains a desired height of the interconnect bumps to maintain a standoff height between the chip and the substrate. The interconnect compensation design improves the reliability of the component.

Although the invention has been described with reference to specific embodiments, it will be understood by those skilled in the art that various changes may be made without departing from the spirit or scope of the invention. For instance, the numerous details set forth herein such as, for example, the specific interconnect patterns and the specific compensation schemes are provided to facilitate the understanding of the invention and are not provided to limit the scope of the invention. Furthermore, the locations of the bonding pads can be overcompensated to reduce the overall stress level within the interconnect bumps. Additionally, the bonding pads of both substrates in a single component can be compensated. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing components comprising:

providing a first substrate having a first coefficient of thermal expansion (CTE), having a first surface, and supporting a first plurality of interconnects located over the first surface in a first predetermined pattern;

providing a second substrate having a second CTE, having a second surface, and supporting a second plurality of interconnects located over the second surface in a second predetermined pattern; and assembling together the first and second substrates at a first temperature outside of a temperature range of approximately 25 to 30° C., wherein:
the first and second pluralities of interconnects are aligned with each other at the first temperature and are substantially misaligned with each other at a second temperature of the temperature range.

2. The method of claim 1 wherein:

providing the first substrate further comprises:
providing the first predetermined pattern located only at a periphery of the first surface; and providing the second substrate further comprises:
providing the second predetermined pattern located only at a periphery of the second surface.

3. The method of claim 1 wherein:

providing the first substrate further comprises:
providing a first grid pattern for the first predetermined pattern; and providing the second substrate further comprises:
providing a second grid pattern for the second predetermined pattern.

4. The method of claim 1 further comprising:

dispensing an underfill material between the first and second substrates; and curing the underfill material between the first and second substrates.

5. The method of claim 1 wherein:

assembling together the first and second substrates further comprises:
heating the first substrate;
electrically coupling together the first and second pluralities of interconnects; and
cooling the first substrate to the first temperature.

6. The method of claim 5 wherein:

assembling together the first and second substrates further comprises:
heating the second substrate; and
cooling the second substrate to the first temperature.

7. The method of claim 5 wherein:

assembling together the first and second substrates further comprises:
aligning together the first substrate and the second substrate before heating the first substrate.

8. The method of claim 5 wherein:

electrically coupling together the first and second pluralities of interconnects occurs after heating the first substrate and before cooling the first substrate.

9. The method of claim 1 wherein:

providing the first substrate further comprises:
providing a first additional plurality of interconnects located over the first surface and adjacent to the first plurality of interconnects.

10. The method of claim 9 wherein:

providing the second substrate further comprises:
providing a second additional plurality of interconnects located over the second surface and adjacent to the second plurality of interconnects.

11. The method of claim 10 wherein:

assembling together the first and second substrates further comprises:
misaligning the first additional plurality of interconnects and the second additional plurality of interconnects at the first temperature; and
the first and second additional pluralities of interconnects are aligned with each other at the second temperature.

12. The method of claim 1 wherein:

providing the first substrate further comprises:
providing the first substrate with a first plurality of dice, each die in the first plurality of dice having a portion of the first plurality of interconnects; and providing the second substrate further comprises:
providing the second substrate with a second plurality of dice, each die in the second plurality of dice having a portion of the second plurality of interconnects.

13. The method of claim 12 further comprising:

singulating the dice of the first plurality of dice from the first substrate; and singulating the dice of the second plurality of dice from the second substrate.

14. The method of claim 13 wherein:

singulating the dice of the first plurality of dice from the first substrate occurs after assembling together the first and second substrates; and singulating the dice from the second plurality of dice from the second substrate occurs after assembling together the first and second substrates.

15. The method of claim 12 wherein:

providing the first substrate further comprises:
providing a location for each of the portions of the first plurality of interconnects to be compensated by portion.

16. The method of claim 12 wherein:

providing the second substrate further comprises:
providing a location for each of the portions of the second plurality of interconnects to be compensated by portion.

17. The method of claim 12 wherein:

providing the first substrate further comprises:
providing a location for each of the portions of the first plurality of interconnects to be compensated by portion and compensated individually within the portion.

18. The method of claim 12 wherein:

providing the second substrate further comprises:
providing a location for each of the portions of the second plurality of interconnects to be compensated by portion and compensated individually within the portion.

19. The method of claim 1 wherein:

providing the first substrate further comprises:
providing a location for each interconnect of the first plurality of interconnects to be compensated individually.

20. The method of claim 1 wherein:

providing the second substrate further comprises:

providing a location for each interconnect of the second plurality of interconnects to be compensated individually.

21. The method of claim 1 wherein:
providing the first substrate further comprises:
providing a location for different groups of the first plurality of interconnects to be compensated by group.

22. The method of claim 1 wherein:
providing the second substrate further comprises:
providing a location for different groups of the second plurality of interconnects to be compensated by group.

23. A method of manufacturing semiconductor components comprising:
manufacturing a plurality of semiconductor devices and a first plurality of interconnects supported by a semiconductor wafer having a first coefficient of thermal expansion (CTE), the first plurality of interconnects having a first predetermined pattern located over a first surface of the semiconductor wafer;
disposing a plurality of interconnect bumps adjacent to the first plurality of interconnects;
providing a capping substrate having a second CTE, a second surface, and a second plurality of interconnects located over the second surface in a second predetermined pattern;
assembling together the semiconductor wafer and the capping substrate at a first temperature greater than approximately 30° C.;
dispensing an underfill material between the semiconductor wafer and the capping substrate after assembling together the semiconductor wafer and the capping substrate; and
curing the underfill material,
wherein:
the first and second pluralities of interconnects are aligned with each other at the first temperature and are substantially misaligned with each other at a second temperature less than or equal to approximately 30° C.

24. The method of claim 23 wherein:
manufacturing the plurality of semiconductor devices and the first plurality of interconnects further comprises:
providing the first predetermined pattern from a first group of patterns consisting of a first peripheral pattern located only at a periphery of the first surface and a first grid pattern located across the first surface;
providing the capping substrate further comprises:
providing the second predetermined pattern from a second group of patterns consisting of a second peripheral pattern located only at a periphery of the second surface and a second grid pattern located across the second surface.

25. The method of claim 23 wherein:
disposing the plurality of interconnect bumps occurs before assembling together the semiconductor wafer and the capping substrate; and
assembling together the semiconductor wafer and the capping substrate further comprises:
aligning together the semiconductor wafer and the capping substrate;
heating the plurality of interconnect bumps above the first temperature;
electrically coupling together the plurality of interconnect bumps and the second plurality of interconnects after heating the semiconductor wafer and the capping substrate;
cooling the plurality of interconnect bumps to the first temperature after electrically coupling together the plurality of interconnect bumps and the second plurality of interconnects; and
solidifying the plurality of interconnect bumps at the first temperature.

26. The method of claim 23 wherein:
manufacturing the plurality of semiconductor devices and the first plurality of interconnects supported by the semiconductor wafer further comprises:
manufacturing a first additional plurality of interconnects supported by the semiconductor wafer, located over the first surface, and located adjacent to the first plurality of interconnects;
providing the capping substrate further comprises:
providing a second additional plurality of interconnects located over the second surface and adjacent to the second plurality of interconnects; and
assembling together the semiconductor wafer and the capping substrate further comprises:
substantially misaligning the first additional plurality of interconnects and the second additional plurality of interconnects at the first temperature; and
aligning together the first additional plurality of interconnects and the second additional plurality of interconnects at the second temperature.

27. The method of claim 23 wherein:
manufacturing the plurality of semiconductor devices and the first plurality of interconnects supported by the semiconductor wafer further comprises:
manufacturing a first plurality of dice in the semiconductor wafer, each die in the first plurality of dice having at least one of the plurality of semiconductor devices and a portion of the first plurality of interconnects;
providing the capping substrate further comprises:
providing the capping substrate with a second plurality of dice, each die in the second plurality of dice having a portion of the second plurality of interconnects; and
the method further comprises:
simultaneously singulating the dice of the first plurality of dice from the semiconductor wafer and the dice from the second plurality of dice from the capping substrate after assembling together the semiconductor wafer and the capping substrate.

28. A component comprising:
a first substrate having a first coefficient of thermal expansion (CTE), a first surface, and a first plurality of interconnects located over the first surface in a first predetermined pattern;
a second substrate having a second CTE, a second surface, and a second plurality of interconnects located over the second surface in a second predetermined pattern,; and
wherein:
the first and second pluralities of interconnects are aligned with each other at a first temperature outside of a temperature range of approximately 25 to 30° C.; and
the first and second pluralities of interconnects are substantially misaligned with each other at a second temperature in the temperature range.

29. The component of claim 28 wherein:

the first predetermined pattern is located only at a periphery of the first surface; and the second predetermined pattern is located only at a periphery of the second surface.

30. The component of claim 28 wherein:

the first predetermined pattern comprises a first grid pattern located across the first surface; and the second predetermined pattern comprises a second grid pattern located across the second surface.

31. The component of claim 28 further comprising:

an underfill material between the first and second substrates.

32. The component of claim 28 further comprising:

a first additional plurality of interconnects located over the first surface and adjacent to the first plurality of interconnects; and a second additional plurality of interconnects located over the second surface and adjacent to the second plurality of interconnects, wherein:
the first additional plurality of interconnects and the second additional plurality of interconnects are substantially misaligned at the first temperature; and the first additional plurality of interconnects and the second additional plurality of interconnects are aligned together at the second temperature.

33. The component of claim 28 wherein:

the first substrate further comprises:
a first plurality of dice, each die in the first plurality of dice having a portion of the first plurality of interconnects; and the second substrate further comprises:
a second plurality of dice, each die in the second plurality of dice having a portion of the second plurality of interconnects.

34. The component of claim 33 wherein:

a location for each of the portions of the first plurality of interconnects is compensated by portion.

35. The component of claim 33 wherein:

a location for each of the portions of the second plurality of interconnects is compensated by portion.

36. The component of claim 33 wherein:

a location for each of the portions of the first plurality of interconnects is compensated by portion and compensated individually within the portion.

37. The component of claim 33 wherein:

a location for each of the portions of the second plurality of interconnects is compensated by portion and compensated individually within the portion.

38. The component of claim 28 wherein:

a location for each interconnect of the first plurality of interconnects is compensated individually.

39. The component of claim 28 wherein:

a location for each interconnect of the second plurality of interconnects is compensated individually.

40. The component of claim 28 wherein:

a location for different groups of the first plurality of interconnects is compensated by group.

41. The component of claim 28 wherein:

a location for each portion of the second plurality of interconnects is compensated by group.

* * * * *